(12) United States Patent
Michaeli et al.

(10) Patent No.: US 9,222,999 B2
(45) Date of Patent: Dec. 29, 2015

(54) MAGNETIC RESONANCE RELAXATION ALONG A FICTITIOUS FIELD

(75) Inventors: Shalom Michaeli, St. Paul, MN (US); Silvia Mangia, Minneapolis, MN (US); Dennis J. Sorce, Cockeysville, MD (US); Michael G. Garwood, Medina, MN (US); Timo Liimatainen, Kuopio (FI)

(73) Assignee: Regents of the University of Minnesota, Minneapolis, MN (US)

( * ) Notice: Subject to any disclaimer, the term of this patent is extended or adjusted under 35 U.S.C. 154(b) by 659 days.

(21) Appl. No.: 13/442,597

(22) Filed: Apr. 9, 2012

(65) Prior Publication Data

US 2012/0286780 A1  Nov. 15, 2012

Related U.S. Application Data

(60) Provisional application No. 61/473,613, filed on Apr. 8, 2011.

(51) Int. Cl.
*G01R 33/50* (2006.01)
*G01R 33/44* (2006.01)

(52) U.S. Cl.
CPC .............. *G01R 33/50* (2013.01); *G01R 33/446* (2013.01)

(58) Field of Classification Search
CPC .............................. G01R 33/50; G01R 33/446
USPC .......................... 324/300–322; 600/407–435; 382/128–131
See application file for complete search history.

(56) References Cited

U.S. PATENT DOCUMENTS

| | | | |
|---|---|---|---|
| 4,820,983 A | 4/1989 | Bendall et al. | |
| 6,219,571 B1 | 4/2001 | Hargreaves et al. | |
| 6,448,769 B1 | 9/2002 | Rosenfeld et al. | |
| 6,750,649 B1 | 6/2004 | Rosenfeld | |
| 7,230,424 B1 | 6/2007 | Morrone | |
| 7,279,899 B2 | 10/2007 | Michaeli et al. | |
| 7,403,006 B2 * | 7/2008 | Garwood et al. | 324/310 |
| 7,425,828 B2 * | 9/2008 | Garwood et al. | 324/310 |
| 7,777,484 B2 * | 8/2010 | Garwood et al. | 324/307 |
| 7,932,719 B2 * | 4/2011 | Liimatainen et al. | 324/307 |
| 8,067,936 B2 * | 11/2011 | Garwood et al. | 324/307 |
| 2005/0024052 A1 * | 2/2005 | Bendall et al. | 324/307 |
| 2006/0244447 A1 | 11/2006 | Michaeli et al. | |
| 2007/0040553 A1 | 2/2007 | Hajimiri et al. | |
| 2007/0188171 A1 * | 8/2007 | Garwood et al. | 324/310 |
| 2007/0188172 A1 * | 8/2007 | Garwood et al. | 324/310 |
| 2009/0027050 A1 * | 1/2009 | Garwood et al. | 324/307 |
| 2010/0237866 A1 * | 9/2010 | Liimatainen et al. | 324/309 |
| 2010/0315082 A1 * | 12/2010 | Garwood et al. | 324/307 |
| 2012/0286780 A1 * | 11/2012 | Michaeli et al. | 324/309 |

FOREIGN PATENT DOCUMENTS

| | | | |
|---|---|---|---|
| WO | WO 2009042168 A2 * | 4/2009 | |
| WO | WO-2009042168 A3 | 4/2009 | |

\* cited by examiner

*Primary Examiner* — Dixomara Vargas
(74) *Attorney, Agent, or Firm* — Schwegman Lundberg & Woessner, P.A.

(57) ABSTRACT

A system includes a driving module, a processor, and a readout module. The driving module is configured to apply a perturbation to a sample. The processor is configured to define a plurality of different rotating frames relative to the perturbation, wherein each frame has a corresponding fictitious field. The readout module is coupled to the processor and is configured to generate an output based on relaxation of the sample as a function of the perturbation.

22 Claims, 14 Drawing Sheets

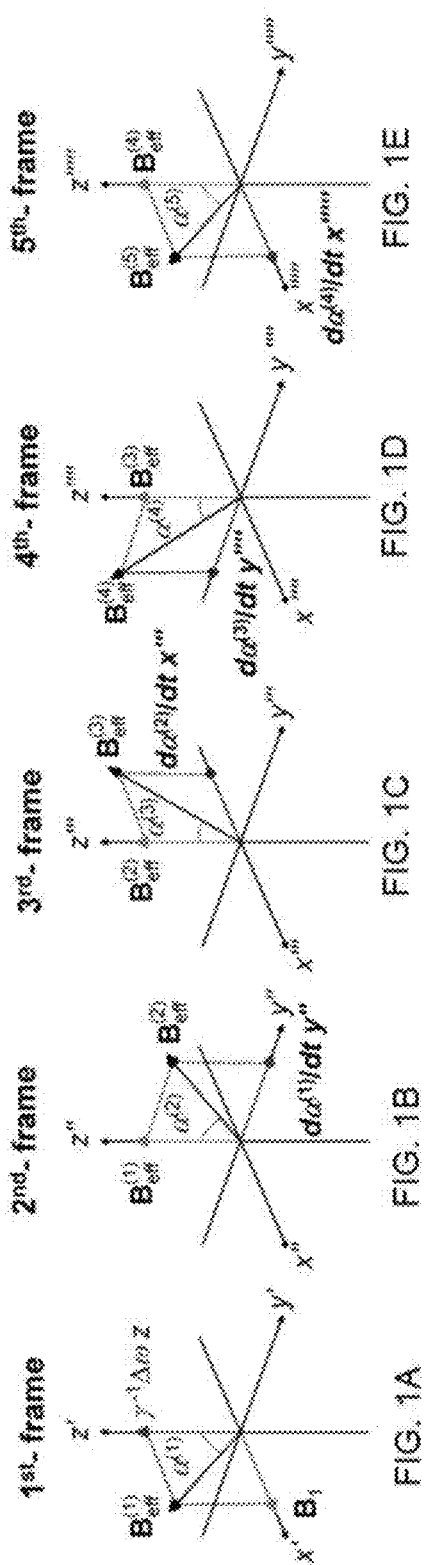

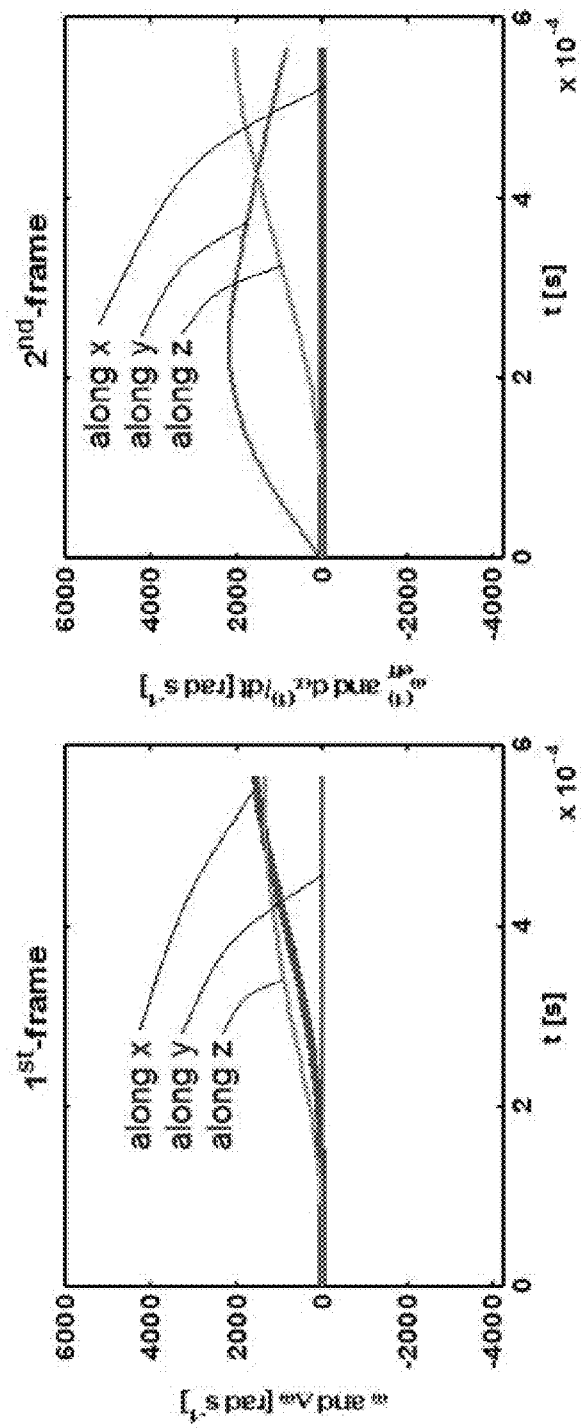

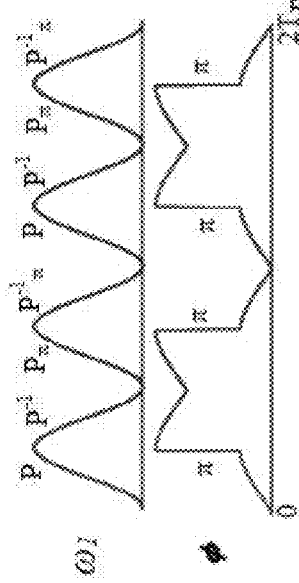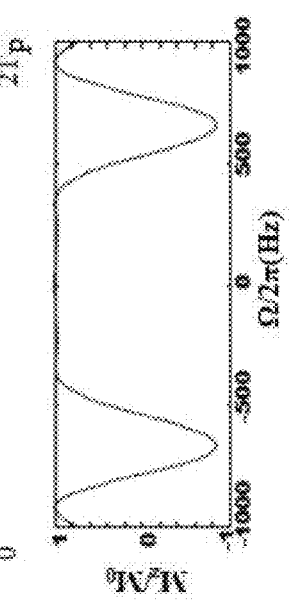
FIG. 7A
FIG. 7B
FIG. 7C

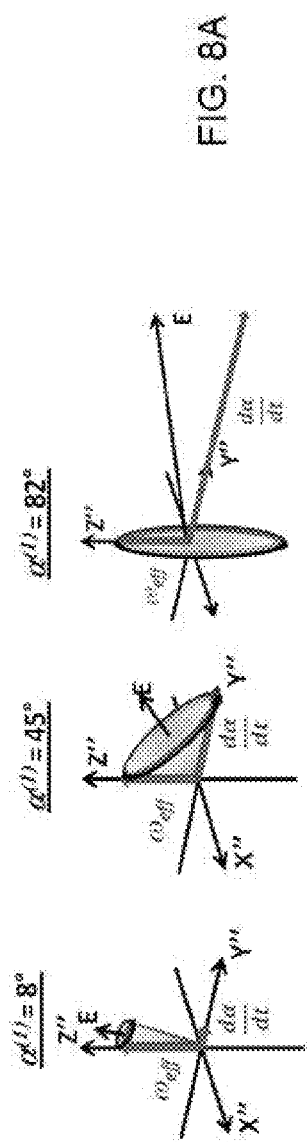

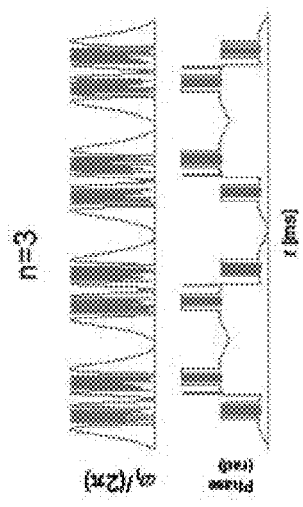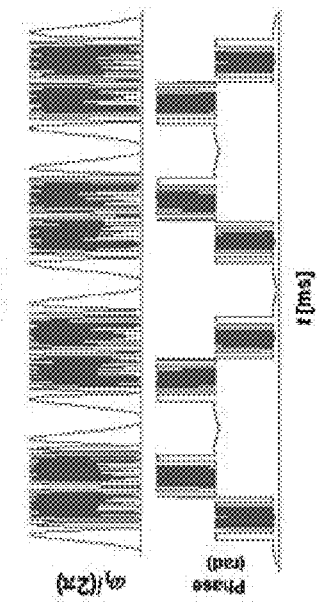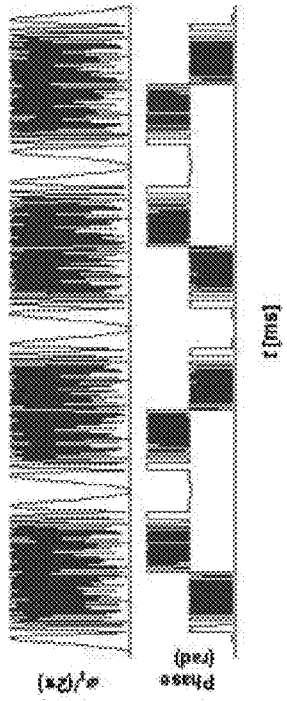

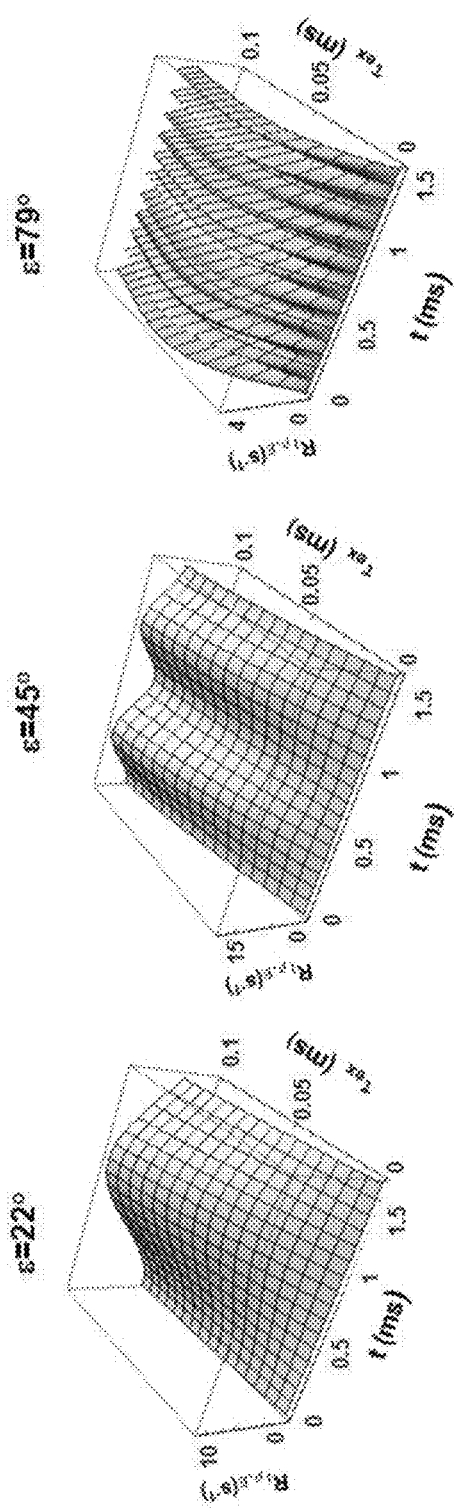
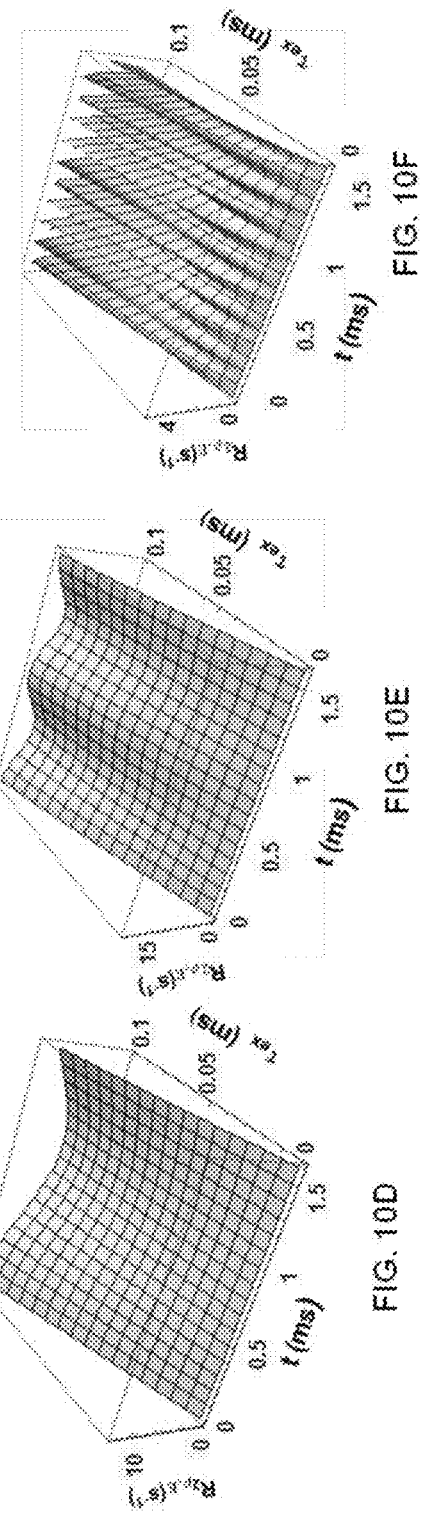
FIG. 10A  FIG. 10B  FIG. 10C
FIG. 10D  FIG. 10E  FIG. 10F

MAGNETIC RESONANCE RELAXATION ALONG A FICTITIOUS FIELD

CLAIM OF PRIORITY

This patent application claims the benefit of priority, under 35 U.S.C. Section 119(e), to Shalom Michaeli et al., U.S. Provisional Patent Application Ser. No. 61/473,613, entitled "ROTARY ECHOES PRODUCED USING FICTITIOUS FIELDS," filed on Apr. 8, 2011, which is hereby incorporated by reference herein in its entirety.

CROSS-REFERENCE TO RELATED PATENT DOCUMENTS

This document is related to: Timo Liimatainen et al., U.S. provisional patent application Ser. No. 60/995,193, entitled "MAGNETIC RESONANCE CONTRAST USING FICTITIOUS FIELD RELAXATION," filed Sep. 25, 2007; and related to Timo Liimatainen et al., U.S. patent application Ser. No. 12/731,936, entitled "MAGNETIC RESONANCE CONTRAST USING FICTITIOUS FIELD RELAXATION," filed Mar. 25, 2010; and related to Timo Liimatainen et al., PCT application serial number PCT/US2008/011103, entitled "MAGNETIC RESONANCE CONTRAST USING FICTITIOUS FIELD RELAXATION," filed Sep. 25, 2008, each of which is incorporated herein by reference.

STATEMENT REGARDING FEDERALLY SPONSORED RESEARCH OR DEVELOPMENT

This invention was made with government support under BTRR-P41 RR008079, P30 NS057091, R01 NS061866, and R21 NS059813, S10 RR023730, and S10 RR027290 from awarded by the National Institutes of Health. The government has certain rights in this the invention.

BACKGROUND

High magnetic fields promise improved imaging using magnetic resonance. However, high magnetic fields are typically associated with high specific absorption rates (SAR). In particular, imaging of a living human tissue is limited by specific absorption rates. In addition, high magnetic fields are susceptible to image artifacts arising from magnetic field inhomogeneity. Field homogeneity is expensive and thus, high magnetic field imaging systems are rather costly. Furthermore, traditional approaches to generating MRI contrast do not provide image details that could lead to improved diagnostic and therapeutic technologies.

OVERVIEW

The present inventors have recognized the limitations of current magnetic resonance imaging methods. For example, current imaging methods do not allow observation of very fast decaying NMR signals, such as that useful for investigation of α-synuclein aggregation during Parkinson's disease, the mechanisms of the plaque formation in Alzheimer's disease.

The present subject matter includes a solution to this problem. One example of a solution includes a series of frequency-swept (FS) pulses under non-adiabatic conditions and having sine and cosine amplitude and frequency modulations, respectively, that enables evolution of the spin system in rotating frame of rank n>2. A non-adiabatic condition can include a sub-adiabatic condition or can include a super-adiabatic condition.

One example includes modulation of the amplitude and frequency based on a tangent function. An example of the present subject matter enables generating locking fictitious magnetic fields having amplitude that is larger than the maximal power of the FS pulses. One example of the present subject matter generates relaxation in the rotating frames of rank n>2 in the presence of time dependent fictitious fields (e.g., no locking of magnetization occurs). For example, with a particular tangent function, the fictitious fields generated during frequency sweep are not stationary and thus, magnetization is not locked.

In addition to the sine, cosine, and tangent functions noted herein as providing a non-adiabatic pulse, it will be appreciated that other types of functions can also be used to generate a non-adiabatic pulse leading to relaxation along a fictitious field. For example, any of the hyperbolic family of functions can be used, such as hyperbolic tangent.

The resulting fictitious magnetic fields can be efficiently flipped, thus eliminating (or reducing) $B_0$ and $B_1$ artifacts and producing relatively artifact-free rotary echoes in the rotating frames. Unlike the Carr-Purcell-Meiboom-Gill (CPMG) method, errors arising based on the reversal of $B_1$ (RF magnetic field) are not cumulative with a rotary spin echo experiment.

The rotary echoes generated using fictitious magnetic fields during frequency swept pulses uses instantaneous flips of 180 degrees and allows for perfect refocusing of magnetization. Because the flips can be designed from the several microseconds to the millisecond time scale, the regime of motion that can be probed by RAFFn method is very broad.

RAFFn can be configured to generate spin relaxations in high rotating frames, thus providing greater flexibility to generate contrasts in MRI than with conventional MR methods and to probe broad motional regimes (from ultra slow to fast motions). The amplitude of the fictitious field generated during RAFFn can be tuned to a specific motional regime while satisfying SAR requirements.

As compared to CPMG, an example of the present subject matter can slow the relaxations (effectively narrowing the line width) and thus provide an opportunity to observe very fast decaying NMR signals. The frequency of precession of magnetization defined by the fictitious field can be configured to be much greater than the maximal power of the frequency-swept pulse. Thus, with similar trajectory of magnetization, the refocusing occurs faster.

One example can be used to generate contrasts in MRI. Theoretical analysis shows that different relaxation pathways (such as exchange and dipolar interactions) depend differently based on the rank n of the rotating frame. For example, exchange can be suppressed at a high rank rotating frame, thus providing an opportunity to alter the contributions of exchange-induced relaxations relative to dipolar interactions as to MR relaxation contrast. In addition, RAFFn enables slowing of relaxations which leads to improvement of the visibility of MR detection. Furthermore, relaxations due to dipolar interactions are also slower with the higher rank of rotating frames. With higher rank frames, the sampled frequencies become broader which provides larger range of sensitivity to molecular motion. The sensitivity of $T_{1\rho}$ at high magnetic fields (3 T and above) to molecular motion is shifted to the kHz range (correlation times $10^{-3}$ to $10^{-6}$ s, slow motion) as compared to free precession $T_1$ which is in the range of MHz of sensitivity. One example provides control and flexibility over the amplitude and orientations of the fictitious fields in the rotating frames, thus creating fictitious fields such that the sensitivity of measurements is shifted to ultra-slow (correlation times $10^{-1}$ to $10^{-2}$ seconds) motional regimes. The opportunity to create fictitious fields with much greater amplitude than the RF power of the FS pulses used, also allows probing of very fast motion. As a result, RAFFn is sensitive to macromolecule dynamics at very low frequencies. Applications for RAFFn can include brain and body imaging and contrasts.

Slow relaxations enables the detection of very fast relaxing components which can be useful for investigation of the α-synuclein aggregation during Parkinson's disease and the mechanisms of the plaque formation in Alzheimer's disease. In addition, improved visibility of MRI may allow imaging of myelination. Novel contrast provided by RAFFn can allow relaxation mapping of cartilage and assessment of the osteoarthritis, disc damage in spine. Detection of head/neck tumor invasion using RAFF-3, RAFF-4 and RAFF-5 may exhibit greater sensitivity to tumor as compared to $T_2$. RAFFn contrast may provide better outline of a tumor border and reveal structural and dynamic feature not otherwise detectable. One example of RAFFn is sensitive to a change of pH, thus enabling creation of pH maps for investigation of cancers (known to have increased extracellular acidity), and stroke.

In one example, the bandwidth (BW) is significantly improved (for example, the profile is flat) and the pulses can be designed with BW of 0.5 to 100 kHz, which allows insensitivity to frequency offsets. RAFFn allows generating locking fields which are much greater than the maximal RF pulse amplitude. This may allow reduction in RF power deposition to the sample (reduce SAR) and allows assessing broad ranges of motional regimes.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 1A, 1B, 1C, 1D, and 1E illustrate frames of reference.

FIGS. 3A-3F illustrate selected components in rotating frames for rank values shown.

FIGS. 7A and 7B illustrate modulation functions for RAFF3 for a pulse having $\alpha^{(2)}=45°$.

FIG. 7C illustrates the bandwidth corresponding to the pulse having $\alpha^{(2)}=45°$.

FIG. 8A illustrates selected tip angles for effective fields using RAFF2.

FIGS. 8B and 8C illustrate corresponding frequency and phase in the time domain.

FIGS. 9A, 9B, and 9C illustrate time domain representations of amplitude modulated and phase modulated functions for RAFFn pulses for selected values of n.

FIGS. 10A-10F include graphical illustrations of relaxation rate constants.

DETAILED DESCRIPTION

Figure 2B:
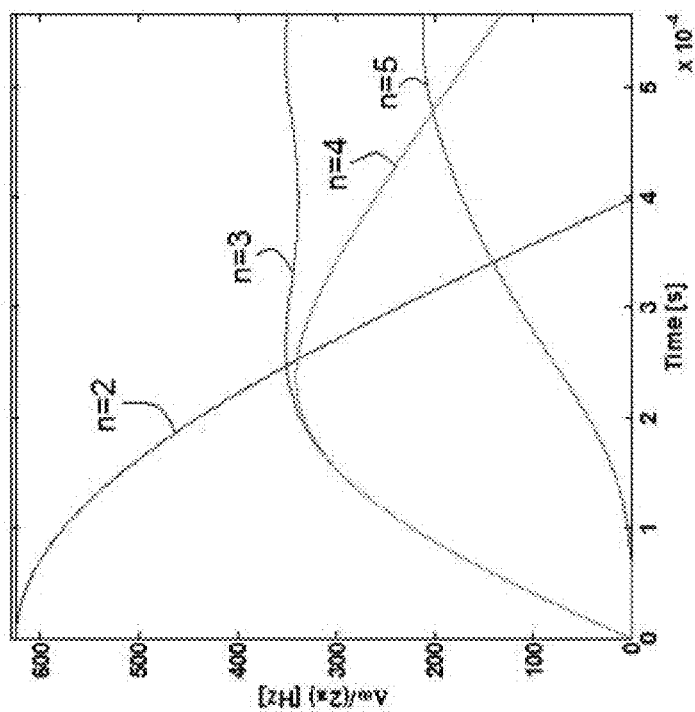
FIGS. 2A and 2B illustrate amplitude and frequency modulations waveforms, respectively, for selected values of n.

An example of the present subject matter is directed to generating MRI contrasts in rotating frames of reference having rank n>1. An example can be used for imaging the human brain at 4 T and a mouse brain at 7 T. In particular, this facilitates investigation of molecular motion and contrast in the high rank rotating frames of reference (of rank n>2). Third frame (n=3) relaxation measurements in solids can be used to assess ultra-slow motion and to reduce the magic angle from approximately 54.5 to 39 degrees. The fictitious field, which can be generated in the second rotating frame (n=2), by sweeping the effective field under non-adiabatic conditions, allow generating relaxation dispersion in living tissue.

The method, entitled RAFF (Relaxation Along a Fictitious Field), provides a correlation between relaxation time constant $T_{RAFF}$ and histologically derived cell density in rat glioma gene therapy model. One example includes a high rotating frame relaxation contrast, of rank n>2, and is denoted RAFFn. By utilizing fictitious fields, novel MRI contrasts can be generated. The method allows for low specific absorption rates and less sensitive to $B_0$ inhomogeneities (broader bandwidth) as compared to RAFF. RAFFn can probe slow motion and generate novel rotating frame relaxation contrast at high magnetic fields.

In solid state NMR, rank n=3 rotating frame experiments can be applied to measure ultra-slow motions and reduce the magic angle from 54.5 to 39 degrees.

The fictitious field can be created by sweeping the frequency of the RF pulse together with amplitude modulation under sub-adiabatic condition, thus creating a fictitious RF field component. The method provides an effective field having an amplitude that differs from that under an adiabatic condition ($\omega_{eff} \gg d\alpha/dt$). As such, contrast, that is, relaxation dispersion in living tissue, can be generated by sweeping the effective field in the first rotating frame under extremely fast passage conditions. Correlation between the relaxation time constant during RAFF pulses ($T_{RAFF}$) and histological derived cell density in rat glioma gene therapy model can be shown.

RAFF with rank=2 (that is, RAFF2) can produce an equal effective field $(\omega_{eff}+d\alpha/dt)^{1/2}$ with lower SAR than continuous wave (CW) spin-lock pulse. RAFF2 has a reasonable offset profile and insensitivity to $B_1$ inhomogeneity, as compared with adiabatic pulses. An example of the present subject matter can provide low SAR, good off-resonance behavior, and the ability to generate contrast.

An example of the present subject matter generates relaxation contrasts and includes a rotating frame having rank n≥2. Fictitious fields as described herein, provide novel MRI contrasts that can be used to examine tissue such as human brain and mouse brain. For example, contrast as between grey matter and white matter varies with different rank.

One example of a method allows for low specific absorption rates and less sensitive relaxation mapping to $B_0$ and $B_1$ inhomogeneities (that is, broader bandwidth) relative to RAFF2. RAFFn can be used to probe slow molecular motions and generate novel rotating frame relaxation contrasts at high magnetic fields.

Spin relaxation is a complex process involving a number of mechanisms. The various mechanisms, or pathways, of relaxation can be evaluated by suitable selection of a rotating frame of reference.

The following are some examples of relaxation mechanisms:

Magnetic dipole-dipole interaction arises between a magnetic moment of a nucleus and a magnetic moment of another nucleus or other entity (an electron, an atom, an ion, a molecule).

Chemical shift anisotropy (CSA) relaxation mechanism is associated with the electronic environment around a nucleus. The environment is non-spherical so the magnitude of the electronic shielding of the nucleus will depend on the molecular orientation relative to a (fixed) external magnetic field.

Spin rotation relaxation mechanism is associated with the interaction between the nuclear spin and a coupling to the overall molecular rotational angular momentum.

Quadrupolar relaxation mechanism is associated with nuclei with spin I≥1 which will have a nuclear dipole and a quadrupole. The nuclear quadrupole interacts with the electric field gradient at the nucleus which is orientation dependent.

Electrostatic interaction relaxation arises due to electrostatic interaction between a nucleus with an electric quadrupole moment and the electric field gradient that exists at the nuclear site due to surrounding charges.

Conventional rotating frame (that is, spins with constant angular frequency) can be used to describe rotations of net magnetization (M). As such, the rotating frame spins with the carrier frequency around a laboratory z-axis ($B_0 = B_0 \vec{z}$) and typically $B_1$ created by RF is aligned along the x-axis. If the RF pulse frequency is modulated during the pulse, the rotating frame can be defined so that the RF pulse $B_1$ points along the x-axis despite the frequency modulation $\Delta\omega(t)$. Due to properties of coordinate transform, frequency modulation creates a new magnetic field component $\gamma^{-1}\Delta\omega(t)$ along axis $\vec{z}'$. In this first rotating frame, having coordinates ($\vec{x}'$, $\vec{y}'$, $\vec{z}'$), an effective field $B_{eff}$ is created as superposition of $B_1(t)$ and $\gamma^{-1}\Delta\omega(t)\vec{z}'$ and its amplitude is $$B_{eff}^{(1)}\sqrt{B_1^2(t)+(\gamma^{-1}\Delta\omega(t))^2}, \quad (1)$$

and the angle between $B_{eff}^{(1)}$ and $\vec{z}'$ is $$\tan(\alpha^{(1)}) = \frac{\omega_1(t)}{\Delta\omega(t)}. \quad (2)$$

If $\omega_1(t)$ and $\Delta\omega(t)$ are time independent, then the $\alpha^{(1)}$ is constant and $B_{eff}^{(1)}$ is locking field for M meaning that M precesses around $B_{eff}^{(1)}$ or M keeps along $B_{eff}^{(1)}$ during the RF pulse.

If $\omega_1(t)$ and $\Delta\omega(t)$ are time dependent and the rate of change is small, that is:

$$\frac{d\alpha^{(1)}}{dt} \ll \omega_{eff}^1, \quad (3A)$$

then the $B_{eff}^{(1)}$ is still approximately a locking field and the condition is called adiabatic condition. When the adiabatic condition is not satisfied (violated) and the $$\frac{d\alpha^{(1)}}{dt} = \omega_{eff}^1 \quad (3B)$$

or $$\frac{d\alpha^{(1)}}{dt} > \omega_{eff}^1, \quad (3C)$$

the system is in the non-adiabatic regime.

Then $B_{eff}^{(1)}$ has an additional component arising from $d\alpha^{(1)}/dt$ after applying the rotation transform of ($\vec{x}'$, $\vec{y}'$, $\vec{z}'$) by $\alpha^{(1)}$ around axis $\vec{y}'$. In this new coordinate system, having coordinates ($\vec{x}''$, $\vec{y}''$, $\vec{z}''$), the locking field will be a superposition of $B_{eff}^{(1)}$ and $\gamma^{-1}d\alpha^{(1)}/dt \, \vec{y}'$, having amplitude $$B_{eff}^{(2)} = \sqrt{B_{eff}^{(1)2}(t)+\left(\gamma^{-1}\frac{d\alpha^{(1)}}{dt}\right)^2}, \quad (4)$$

and the angle between $B_{eff}^{(2)}$ and $\vec{z}''$ $$\tan(\alpha^{(2)}) = \frac{\omega_{eff}^{(1)}(t)}{\frac{d\alpha^{(1)}}{dt}} \quad (5)$$

Elsewhere, the term $\alpha^{(1)}$ may be marked as $\alpha$, $\alpha^{(2)}$ as $\epsilon$ and $B_{eff}^{(1)}$ as $B_{eff}$ and $B_{eff}^{(2)}$ as E. The coordinate transform to the next coordinate system will occur around $\vec{x}''$ and the next one around $\vec{y}'''$, as shown in FIGS. 1A through 1E.

FIGS. 1A-1E illustrate rotating frames of reference. Alternating frequency of RF pulse causes a fictitious RF field along the z' axis in the $1^{st}$-frame (n=1), as shown in FIG. 1A. The effective field $B_{eff}^{(1)}$ appears as superposition of $B_1$ and fictitious field component $\gamma^{-1}\Delta\omega\vec{z}$. Alternating $\alpha^{(1)}$ creates a field component with an amplitude of $\gamma^{-1}d\alpha^{(1)}/dt$ along y" axis in $2^{nd}$-frame (n=2), as shown in FIG. 1B. If $B_{eff}^{(2)}$ sweeps in y" z" plane, then the fictitious component $\gamma^{-1}d\alpha^{(2)}/dt$ is created along $-x'''$ axis following right hand grip rule (n=3), as shown in FIG. 1C. The coordination transforms are reasonable as far as $\gamma^{-1}d\alpha^{(n)}/dt \ll B_{eff}^{(n)}$. FIGS. 1D and 1E show n=4 and n=5, respectively.

More generally, the recursive function for the effective field can be written as:

$$B_{eff}^{(n)} = \sqrt{B_{eff}^{(n-1)2}(t)+\left(\gamma^{-1}\frac{d\alpha^{(n-1)}}{dt}\right)^2}, \quad (6)$$

and the angle between $B_{eff}^{(n)}$ and $\vec{z}'''$:

$$\tan(\alpha^{(n)}) = \frac{\omega_{eff}^{(n-1)}(t)}{\frac{d\alpha^{(n-1)}}{dt}}. \quad (7)$$

To obtain time invariant amplitude effective field in the first rotating frame (n=1), the amplitude and frequency modulation functions are:

$$\omega_1^{RAFF1}(t)=\omega_1^{max}$$

$$\Delta\omega^{RAFF1}(t)=\omega_1^{max} \quad (8)$$

where $\omega_1^{max}$ is a peak RF power in units of rad s$^{-1}$, can be selected. To obtain time invariant amplitude effective field in n$^{th}$ rotating frame, the equations can be written as:

$$\omega_1^n(t) = \Delta\omega^{n-1}(t)\sin(\int\omega_1^{n-1}(t)dt) \qquad 5$$

$$\Delta\omega_1^n(t) = \Delta\omega^{n-1}(t)\cos(\int\omega_1^{n-1}(t)dt) \qquad (9)$$

for n=2, 4, 6, . . . and $$\omega_1^n(t) = \omega_1^{n-1}(t)\sin(\int\Delta\omega^{n-1}dt)$$

$$\Delta\omega_1^n(t) = \omega_1^{n-1}(t)\cos(\int\Delta\omega^{n-1}dt) \qquad (10)$$

for n=3, 5, 7, . . . .

Figure 2A:
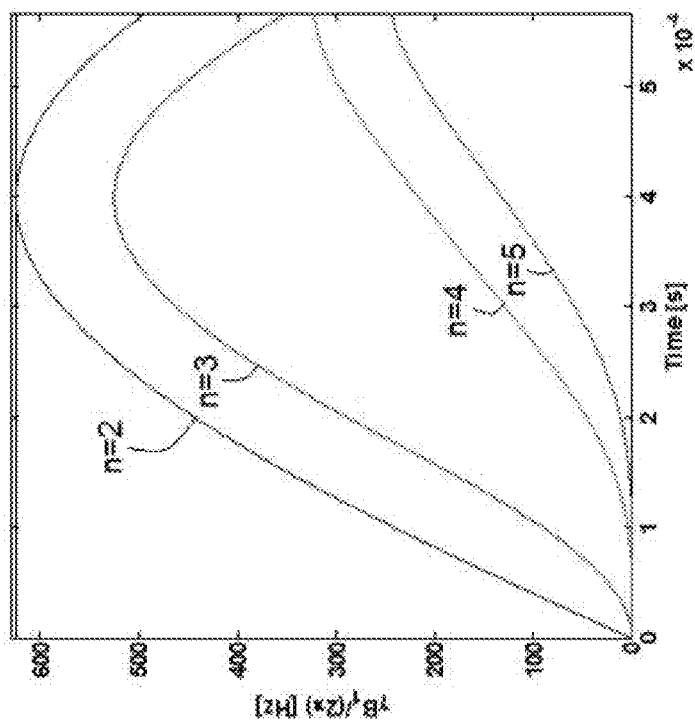
Figure 3D:
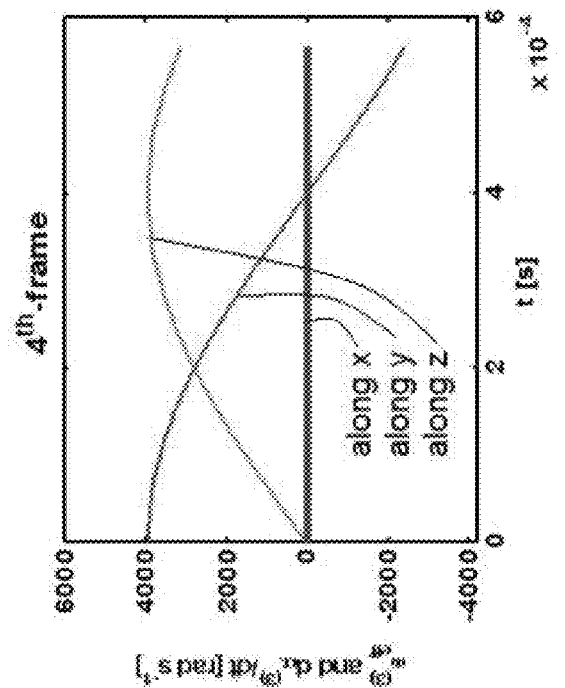
Figure 3C:
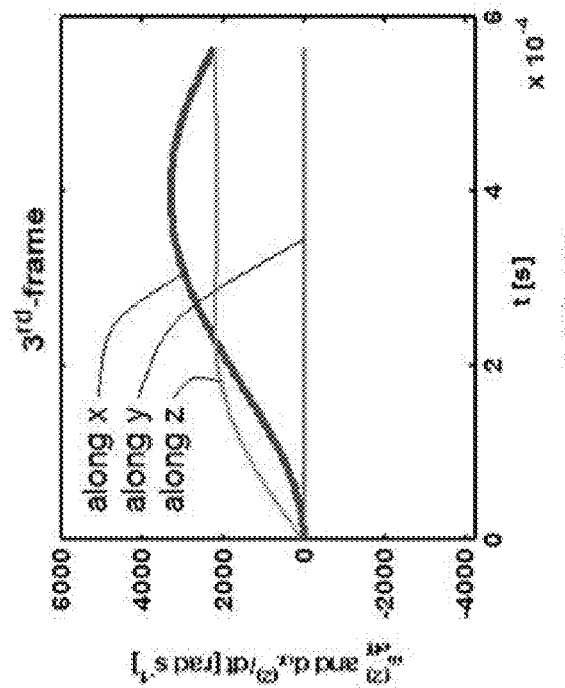
Figure 3E:
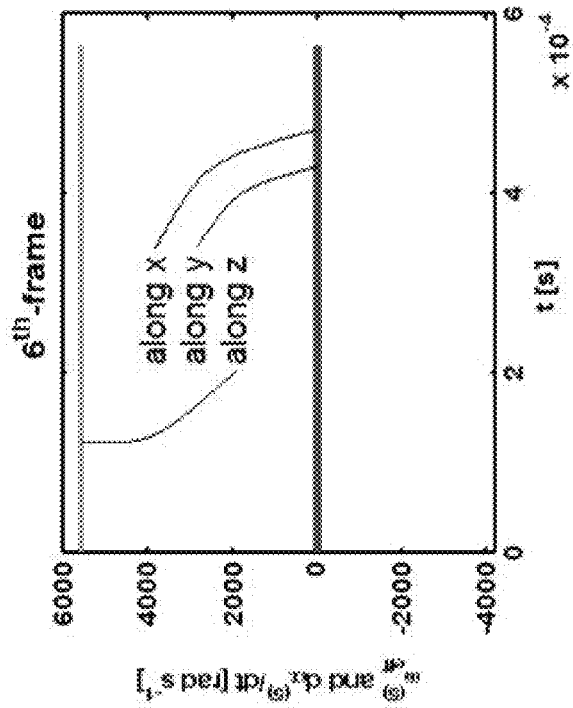
Figure 3F:
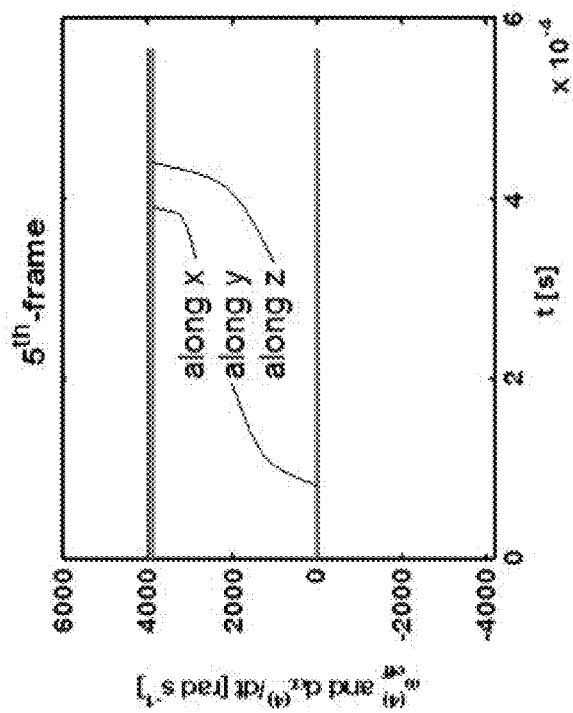

Such equations lead to waveforms in which the effective field remains time invariant and also invariant of n. Because fictitious fields amplitude is additive when n is increased, lower effective $\omega_1^{max}$ is sufficient to generate an effective field with similar amplitude with higher n. This is illustrated in FIGS. 2A and 2B which shows RAFFn amplitude and frequency modulation waveforms for n=2 to n=5.

FIGS. 3A-3F illustrate selected RF components for RAFF5 in different rotating frames of reference. In the first frame, shown in FIG. 3A, relatively small amplitude $\gamma B_1$ and $\Delta\omega$ components are applied. The amplitude of the final effective field (shown in FIG. 3F in the example shown) is summed up frame-by-frame according to Equations 9 and 10. The recursive nature of RAFFn pulses is illustrated in FIGS. 3A-3F where RAFF5 RF pulse spatial components are shown in different coordinate systems. Note that for each RAFFn, the time invariant effective field (that is, the fictitious field) originates from two n$^{th}$ frame components. The locking property of the pulses can be confirmed using Bloch simulations of magnetization under RAFFn irradiation. When comparing RAFF5 RF components in different rotating frames, it can be seen that RAFF4 amplitude and frequency modulations functions can be found in 2$^{nd}$ frame, RAFF3 in 3$^{rd}$ frame, RAFF2 in 4$^{th}$ frame and also RAFF1 in 5$^{th}$ frame due to the recursive property of RAFFn.

Figure 4:
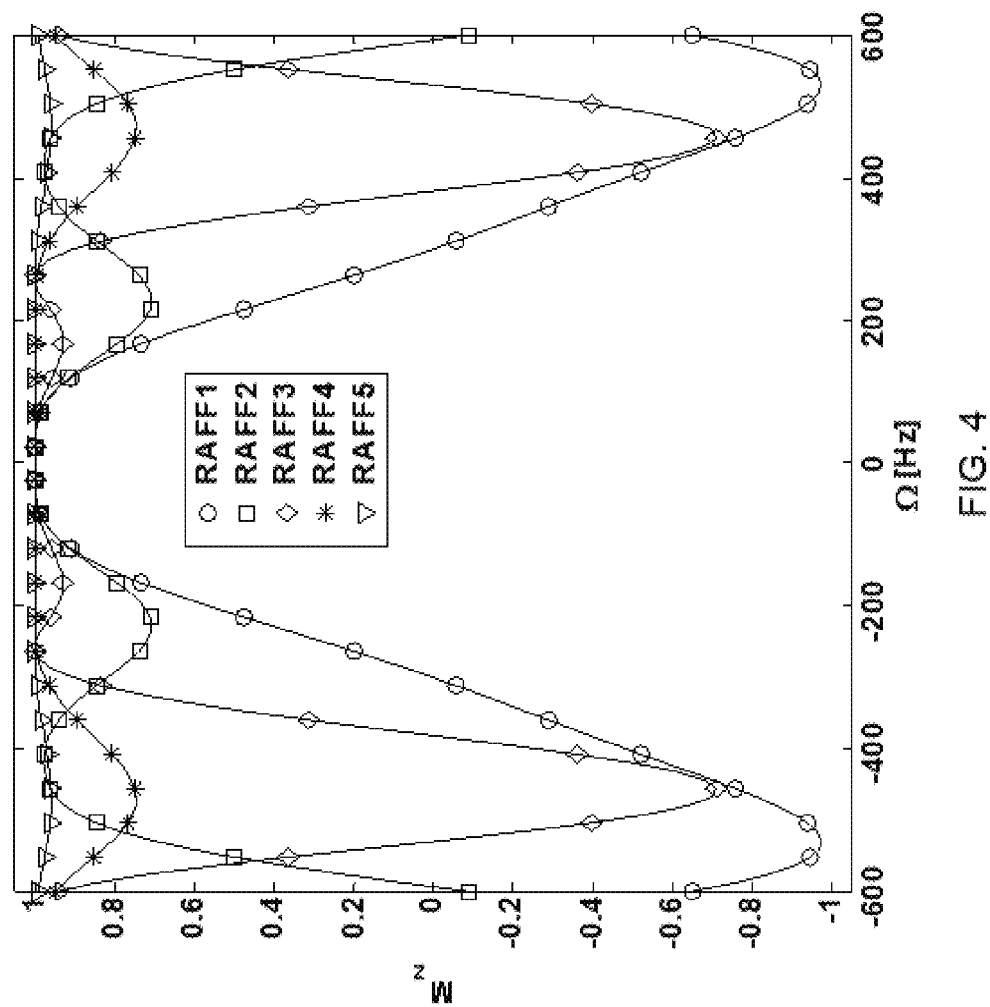
FIG. 4 illustrates Bloch simulated offset profiles.

The off-resonance profile of RAFF1 and RAFF2 are almost identical when $0.9 \cdot M_0$ is held as a limit for PP$^{-1}$P$_\pi$P$_\pi^{-1}$ packet. When n increases, the bandwidth also increases and is over ±600 Hz for RAFF5 as shown in FIG. 4. The data shown in FIG. 4 represents Bloch simulated RAFF offset profiles for n=1 to n=5 using refocusing PP$_\pi$P$_\pi^{-1}$P$^{-1}$ and assuming infinite T$_1$ and T$_2$ relaxations.

Figure 5:
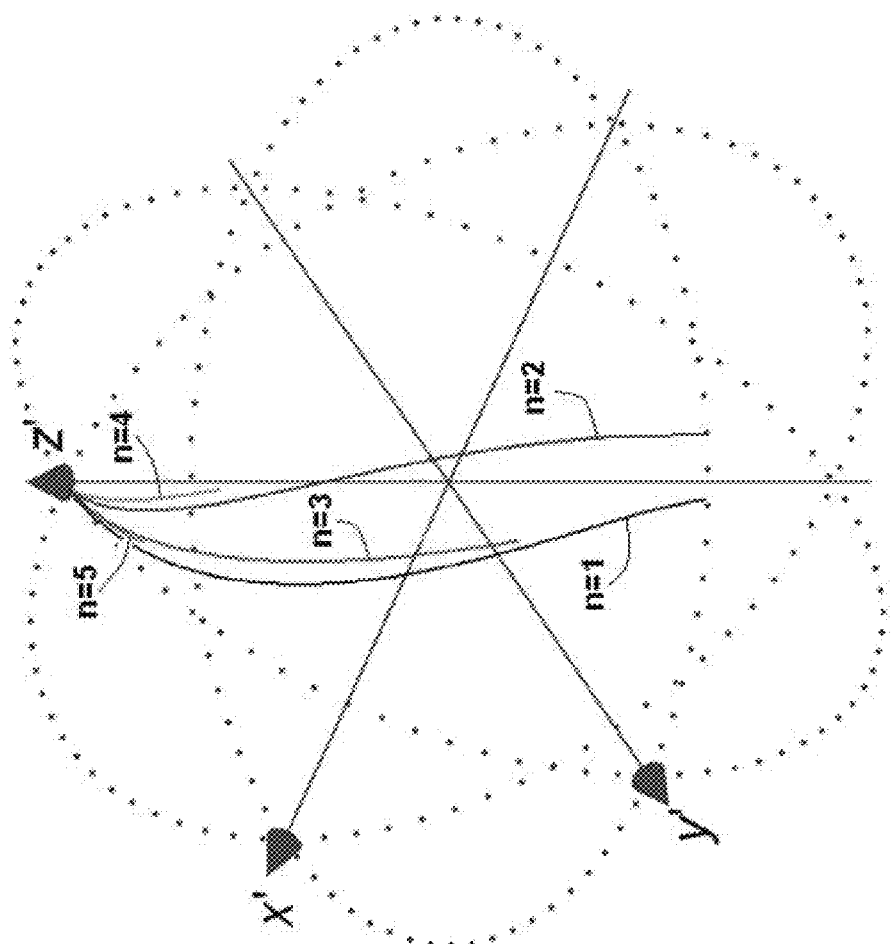
FIG. 5 illustrates magnetization pathways for selected pulses.

Magnetization paths of RAFFn pulses are shown in FIG. 5 for n=1 to n=5. As shown, RAFF1 and RAFF2 flip magnetization up to 90° from the z' axis to x'y' plane and RAFF3-5 excites M gradually less and less ending at couple of degrees in flip for RAFF5.

Bloch simulations can demonstrate that magnetization tips with smaller tip angle in the laboratory frame when the rank of frame n is increased. This leads to the lengthening of $T_{RAFF}$.

Using Equations 8-10, the amplitude of effective field is held constant ($\sqrt{2}\omega_1^{max}$) during RAFFn. In the examples shown, $\omega_1^{max}/(2\pi)=625$ Hz and pulse duration $T_p=4/(\sqrt{2}\omega_1^{max})$ however other frequencies and pulse durations can also be used. The signal intensity decay can be measured by increasing the number of PP$^{-1}$P$_\pi$P$_\pi^{-1}$ packets forming pulse train lengths between 0 and 144 ms so that measurement is repeated both with and without an initial inversion pulse. One example of the recursive expansion which leads to time dependent fictitious field in the n$^{th}$ frame is given by:

$$RAFF3: \Delta\omega[t] = \omega_1^{max}\text{Cos}[\Omega^{(1)}[t]t\tan(\alpha^{(1)})\tan[\alpha^{(0)}[t]t]]; \qquad (11a)$$

$$\omega_1[t] = \omega_1^{max}\text{Sin}[\Omega^{(1)}[t]t\tan(\alpha^{(2)})\tan[\alpha^{(1)}[t]t]];$$

$$RAFF4: \Delta\omega[t] = \omega_1^{max}\text{Cos}[\Omega^{(2)}[t]t\tan(\alpha^{(2)})\tan[\alpha^{(1)}[t]t]]; \qquad (11b)$$

$$\omega_1[t] = \omega_1^{max}\text{Sin}[\Omega^{(2)}[t]t\tan(\alpha^{(2)})\tan[\alpha^{(1)}[t]t]];$$

$$\Omega^{(0)}[t] = \sqrt{\Delta\omega[t]^2 + \omega_1[t]^2}\,; \qquad (12)$$

$$RAFF2: \Omega^{(1)}[t] = \sqrt{\Omega^{(0)}[t]^2 + \dot\alpha^{(0)}[t]^2}\,;$$

$$RAFF3: \Omega^{(2)}[t] = \sqrt{\Omega^{(1)}[t]^2 + \dot\alpha^{(1)}[t]^2}\,;$$

$$RAFF4: \Omega^{(3)}[t] = \sqrt{\Omega^{(2)}[t]^2 + \dot\alpha^{(2)}[t]^2}$$

$$\alpha^{(0)}[t] = \text{ArcTan}\left[\frac{\omega_1[t]}{\Delta\omega[t]}\right];$$

$$RAFF2: \alpha^{(1)}[t] = \text{ArcTan}\left[\frac{\dot\alpha^{(0)}[t]}{\Omega^{(0)}[t]}\right];$$

$$RAFF3: \alpha^{(2)}[t] = \text{ArcTan}\left[\frac{\dot\alpha^{(1)}[t]}{\Omega^{(1)}[t]}\right];$$

$$RAFF4: \alpha^{(3)}[t] = \text{ArcTan}\left[\frac{\dot\alpha^{(2)}[t]}{\Omega^{(2)}[t]}\right]$$

Two approaches can be considered. In the first approach, the fictitious field in the rotating frame of rank n remains stationary. In the second approach, the fictitious field is time dependent in the n$^{th}$ rotating frame and as such, is not stationary. These two approaches are complementary. One advantage of RAFFn with time dependent fictitious field is that it provides greater range of frequencies upon Fourier transformation. This feature promises better sensitivity to a range of motional correlation times.

A human subject can be scanned using a 4-T magnet interfaced to a console coupled to a 90-cm-bore. According to one example, a volume coil (based on transverse electromagnetic design) can be used for RF transmission and reception. The readout for RAFFn weighted images can be based on fast spin echo readout (TR=5, effective TE=74 ms s, ETL=16, Field-of-View 256×256 mm$^2$ and slice thickness 4 mm).

In addition, a mouse brain can be imaged using an example of the present subject matter. Mice (weight 24.4±3.4 g, n=5) can be anesthetized using isoflurane and during imaging, anesthesia can be maintained using isoflurane in NO$_2$/O$_2$. While held at a constant core temperature, mouse measurements can be carried out at 7-T magnet using fast spin echo readout after RAFFn preparation (TR/effective TE=2500/8.6 ms and 2.5 s, echo train length 8, k-space center acquired with 1$^{st}$ echo).

Using human brain data, mouse brain data, or other image data, maps of relaxation time constants and B$_1$ can be calculated on a pixel-by-pixel analysis with suitable software taking into account formation of the steady state. Regions of interest (ROIs) can be hand-drawn based on T$_2$ weighted images. Steady state formation can be taken into account in RAFFn fitting. Relative SAR values can be calculated by integrating over the actual square of the RF pulse envelopes.

In some examples, the pulse profile frequency content is linked with sensitivity for molecular motions having similar frequencies. According to one example, RAFF1 includes continuous wave irradiation which leads to single frequency at $\omega_1^{max}$. RAFF2 includes a sine waveform which leads to sensitivity for one frequency since frequency of modulation is equal to $\omega_1^{max}$. However, more frequencies are included due to limiting pulse duration smaller to half of wavelength. For RAFFn where n>2, additional frequencies are included due to more complex amplitude modulations.

As shown in Table 1, specific absorption rates (SAR) calculated for the same length RAFFn pulses exhibit decreased SAR when n is increased while the effective field is held constant. For example, the SAR decreases from RAFF1 to RAFF5 by over 96%. While the table below, and certain of the examples, describes rank n in the range of 1 to 5, this is not to be construed as a limit. Instead, advantageous results can be obtained using rank n=8 and other values. Rank n is not limited to any particular range of values but can have any value.

TABLE 1

| RAFFn | Relative SAR |
|---|---|
| 1 | 100% |
| 2 | 61% |
| 3 | 36% |
| 4 | 8% |
| 5 | 4% |

Relaxation time maps illustrate changes in MRI contrast when n increases from 1 to 5, which agrees with correlation analysis and average $T_{RAFFn}$ values from grey/white matter shown in Table 2. Indeed, for some sample data, the correlation between $T_{RAFF2}$ and $T_{RAFF5}$ differs from the correlation between $T_{RAFF4}$ and $T_{RAFF5}$ both in the human and mouse brains. In addition, tissue specificity of RAFFn varies with the increase of n, that is, the distribution of relaxation time constants differ in the human grey matter as shown with RAFF1-3 and the relaxation time constants differ in human white matter with RAFF2-5. The grey/white matter contrast increases at high rotating frames as shown in Table 3 and, in the example shown, has a peak with RAFF4.

Figures 6A, 6B:
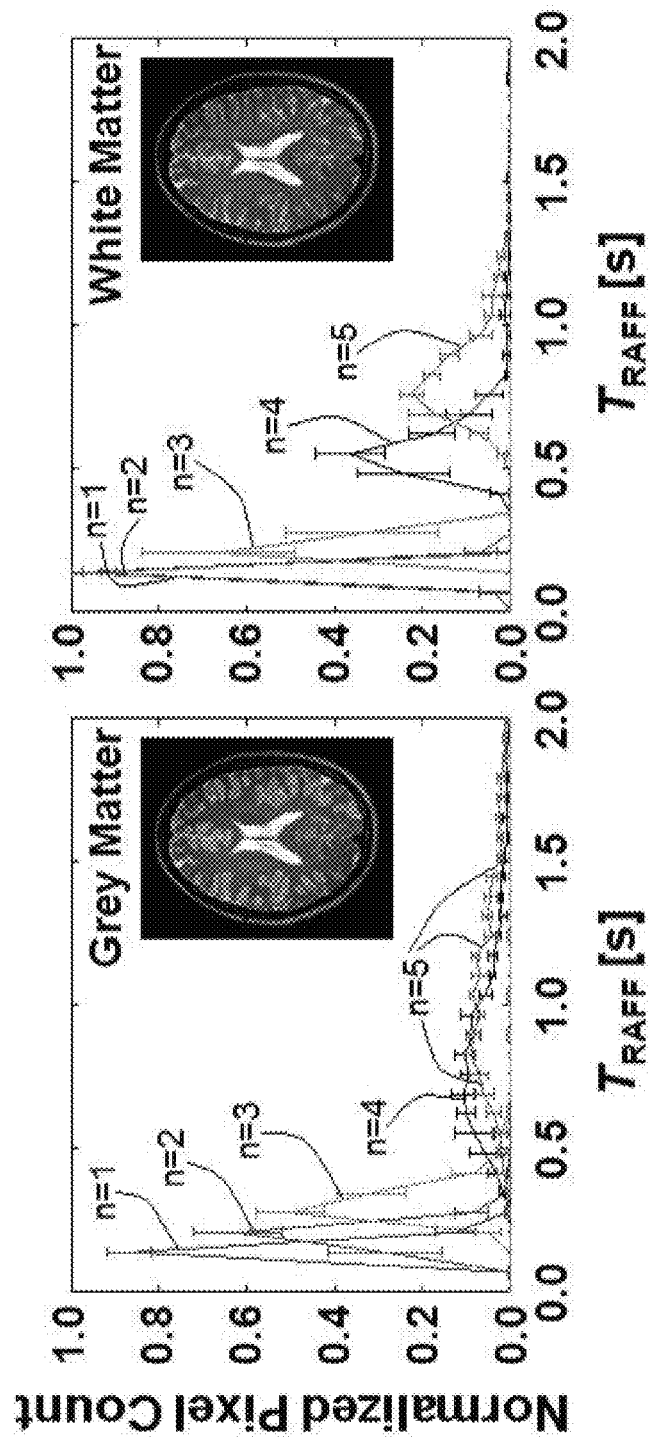
FIGS. 6A and 6B illustrate $T_{RAFFn}$ histograms for grey matter and white matter, respectively.

FIGS. 6A and 6B illustrate average $T_{RAFFn}$ relaxograms in human grey matter and white matter, respectively, at 4 T. As shown in the figures, the RAFF1 line lies under RAFF2 line in white matter panel.

Table 2 includes sample data showing $T_{RAFFn}$ in human and mouse brain. The values shown represent mean±std, in ms, (*p<0.05, **p<0.01 Student's t-test).

TABLE 2

| | Grey | | White |
|---|---|---|---|
| HUMAN | | | |
| RAFF1 | 144.3 ± 9.4 | * | 113.8 ± 3.6 |
| RAFF2 | 195.0 ± 14.9 | ** | 146.7 ± 0.9 |
| RAFF3 | 323.6 ± 16.8 | *** | 227.9 ± 15.5 |
| RAFF4 | 973.4 ± 71.8 | ** | 611.2 ± 95.3 |
| RAFF5 | 1171.2 ± 178.6 | * | 804.2 ± 65.6 |
| MOUSE | | | |
| RAFF1 | 69.7 ± 2.1 | ** | 83.0 ± 5.1 |
| RAFF2 | 97.8 ± 3.7 | ** | 111.3 ± 6.2 |
| RAFF3 | 138.9 ± 4.2 | ** | 151.7 ± 7.2 |
| RAFF4 | 428.7 ± 5.2 | | 415.6 ± 9.2 |
| RAFF5 | 648.5 ± 6.3 | ** | 610.5 ± 22.5 |

Table 3 includes data showing contrast between grey matter and white matter in human brain at 4 T and mouse brain at 7 T. In this example, contrast is calculated as $(T_{RAFFn}(GM) - T_{RAFFn}(WM))/T_{RAFFn}(GM)$.

TABLE 3

| RAFFn | Contrast, human | Contrast, mouse |
|---|---|---|
| RAFF1 | 27% | −19% |
| RAFF2 | 33% | −14% |
| RAFF3 | 42% | −9% |
| RAFF4 | 48% | 3% |
| RAFF5 | 40% | 6% |

An example of the present subject matter includes a spin lock imaging technique based on relaxation along a fictitious field. For example, a processor coupled to a MRI system can iteratively produce pulses that generate a constant effective field in a selected rotating frame of reference. The pulses can be generated with frame rank of, for example, n=1 to 5 or greater, and these can be applied to demonstrate contrast change in tissue, such as human brain and in mouse brain. A peak contrast between grey and white matter can be obtained with RAFF4 in human brain with reduced SAR when compared with RAFF2 or off-resonance CW $T_{1\rho}$ (RAFF1).

Differences between grey matter and white matter in human brain can be revealed using, for example, RAFF3, if relaxation times are considered. Contrast to noise ratio (CNR) can also be calculated at, for example, RAFF4. In the mouse data, contrast increases gradually from −19% to 6% indicating different behavior of the contrast in mouse brain. Negative contrast can be generated in human brain $T_{1\rho}$ using a center-out EPI readout sequence. Differences in contrast as between mouse brain and human brain may be due to different effective echo times in the readout sequences. The echo time of 72 ms in human measurements results in $T_2$ filtering of spin pools with short $T_2$s which can contribute to $T_{RAFFn}$ in mouse measurements.

Magnetization path analysis can reveal that magnetization is flipped by 90° with RAFF1 and RAFF2 while flip angle gradually decreases with higher n (in one example, up to n=5). $T_{RAFFn}$ increases when n increases, which may be related to decreasing amount of spin-spin dephasing. The Fourier transform of the pulse profiles show that when n is increased, more frequencies are included into the pulse profile which can be linked to sensitivity to molecular motions of these particular frequencies. This sensitivity difference may result in contrast differences between grey and white matter with RAFFn.

In one example, magnetization transfer contributes to the RAFFn contrast in tissue. Using simulations based on product operators, the sensitivity of RAFFn to anisochronous exchange ($\Delta\omega \neq 0$) is shifted to slower motional regime and decreased when n is increased as compared to $T_{1\rho}$ and Carr-Purcell-Meiboom-Gill relaxation techniques.

Pulse profile is a factor when off-resonances are present in the sample. RAFF1 can produce reasonable pulse profile in the range of ±100 Hz, however, in some applications, such as imaging of abdomen, larger bandwidth may be used. Enhancement of pulse profile may be observed when n is increased.

One example of the present subject matter allows performing relatively artifact-free rotating frame experiments with reduced SAR at high magnetic fields.

A general solution for exchange-induced relaxation between two spins with different chemical shifts in the presence of a fictitious field can be derived. The following section describes relaxations during frequency swept radio-frequency pulses. The fictitious field is generated by sweeping frequency in the non-adiabatic regime, that is, when the adiabatic condition $d\alpha/dt \ll \gamma^{-1}B_{eff}$ is not satisfied. Here, $d\alpha/dt$ is the angular velocity and $B_{eff}$ is the effective magnetic field. The fictitious field E is the vector sum of $B_{eff}$ and the $\gamma^{-1} d\alpha/dt$ ŷ and is collinear with the axis of quantization Z'" of the third rotating frame (TRF, n=3). The relaxations can be treated upon transformation to the TRF and the solution presented can be extended to a general case of relaxations in the rotating frames of ranks n>2.

A fictitious field, E generated during radiofrequency (RF) irradiation using frequency swept (FS) pulses can be a locking magnetic field. Using E fields, in vivo MRI contrast can be generated. In the presence of RF irradiation using FS pulses, the RF is stationary in the $\Omega_{RF}(t)$ frame, which rotates around the laboratory Z. By convention, the axes of the $\omega_{RF}(t)$-frame are labeled X', Y', Z', which are also defined here as the first rotating frame (FRF, n=1). A fictitious field can be used for relaxation dispersion measurements. The formalism for dipole-dipole interactions between identical (like) spins can be shown, where dipolar Hamiltonian is transformed from $\Omega_{RF}(t)$ to $\Omega_{eff}(t)$ and farther to the $\Omega_E(t)$ frames, the second (SRF, n=2) and the third rotating frames (TRF, n=3), respectively. In these frames, $\Omega_{RF}$, $\Omega_{eff}$ and $\Omega_E$ are stationary.

Consider relaxation in the presence of a fictitious field when the dominant relaxation mechanism is two site exchange (2SX) in the fast-exchange regime. A method of derivation can be used to describe rotating frames of rank n>2.

Exchange-induced relaxations in the presence of adiabatic pulses of the hyperbolic secant (HSn) family can be derived, wherein the theoretical treatment of exchange-induced relaxation is given in the $\Omega_{eff}(t)$ frame. Here, derivations of the exchange induced relaxations are described in the $\Omega_E(t)$ frame or the third rotating frame of reference.

Consider a general time-dependent Hamiltonian which is written in the laboratory frame as:

$$H_T(t) = H_Z + H_{RF}(t) + H_{ex}(t) \tag{13}$$

Here $H_T(t)$ is the total Hamiltonian which is the sum of the Zeeman component $H_Z$, a time-dependent radio frequency term, $H_{RF}(t)$, and the Hamiltonian representing the exchange in the system $H_{ex}(t)$. Assume the radio frequency term includes a rotating term in phase with the precession of the applied RF.

$$H_T(t) = \omega_0 I_z + \omega_1(t)\text{Exp}(-i\omega t I_z)\tilde{I}_x \text{Exp}(i\omega t I_z) + H_{ex}(t) \tag{14}$$

Here, $\omega_o$ is the Larmor frequency of the spin, $\omega_1(t)$ is the time-dependent RF amplitude, $\omega$ is the frequency of the applied RF and $I_z$ is the z component of the spin angular momentum. Apply the operator $\text{Exp}(i\omega t I_z)$ to the total Hamiltonian to obtain:

$$\tilde{H}_T(t) = \Delta\omega(t)\tilde{I}_z + \omega_1(t)\tilde{I}_x + \tilde{H}_{ex}(t) \tag{15}$$

The single tilde above the operator signifies an operator in the first rotating frame (FRF). Here $\Delta\omega(t)$ is the time-dependent frequency offset of the RF and $\omega_1(t)$ is the time-dependent RF amplitude. Next, the total Hamiltonian given by Equation 13 can be transformed to the second rotating frame (SRF) by applying the operator:

$$\text{Exp}(i\alpha(t)I_y) \tag{16}$$

Where:

$$\alpha(t) = \text{ArcTan}\left(\frac{\omega_1(t)}{\Delta\omega(t)}\right) \tag{17}$$

This results in the attainment of a Hamiltonian in the SRF which has the form:

$$\tilde{\tilde{H}}_T(t) = \Omega_{eff}(t)\tilde{\tilde{I}}_z + \tilde{\tilde{H}}_{ex}(t) \tag{18}$$

With the definition:

$$\Omega_{eff}(t) = \sqrt{\Delta\omega(t)^2 + \omega_1(t)^2} \tag{19}$$

The double tilde indicates an operator in the SRF. One can apply an indefinite number of frames to the analysis of the spin dynamics when higher rotating frames with rank n>2 more closely describe the motion up until a limited regime. Consider the transform to a higher frame, i.e. the third rotating form (TRF), in which there is a fictitious field which is generated by the motion of the coordinate system around the X" axis in the SRF, is stationary (i.e., E∥Z'"). This results in an amended Hamiltonian of the form:

$$\tilde{\tilde{H}}_T(t) = \Omega_{eff}(t)\tilde{\tilde{I}}_z + (d(\alpha(t)/dt))\tilde{\tilde{I}}_x + \tilde{\tilde{H}}_{ex}(t) \tag{20}$$

As in the previous case, this Hamiltonian can be transformed to a third rotating frame around an operator which has been defined with the definitions:

$$\tilde{\tilde{\tilde{H}}}_T(t) = \Omega_E(t)\tilde{\tilde{\tilde{I}}}_z + \tilde{\tilde{\tilde{H}}}_{ex}(t) \tag{21}$$

Where:

$$\Omega_E(t) = \sqrt{\Omega_{eff}(t)^2 + (d\alpha(t)/dt)^2} \tag{22}$$

Define:

$$\tilde{\tilde{\tilde{I}}}_z = \tilde{\tilde{I}}_z \text{Cos}(\varepsilon(t)) + \tilde{\tilde{I}}_y \text{Sin}(\varepsilon(t)) \tag{23}$$

With:

$$\varepsilon(t) = \text{ArcTan}\left(\frac{d\alpha(t)/dt}{\Omega_{eff}(t)}\right) \tag{24}$$

And the rotation is around the X" axis of the SRF (or $\Omega_{eff}$ frame).

With the above background, consider the effect of the term $\tilde{\tilde{\tilde{H}}}_{ex}(t)$ on the relaxation of the spin in the $\Omega_E$. The two-site exchange Hamiltonian can be described as:

$$\tilde{\tilde{\tilde{H}}}_{ex}(t) = \delta(t)\tilde{\tilde{\tilde{I}}} \tag{25}$$

Where $\delta(t)$ is a stochastic operator that has a value of 1 when occupying either of the two sites A or B and zero otherwise.

Next, an expression for $\tilde{\tilde{\tilde{I}}}$ can be derived.

Define the following transforms valid in the laboratory frame:

$$\text{Exp}(i\omega t I_z)T_{10}\text{Exp}(-i\omega t I_z) = T_{10} \tag{26A}$$

$$\text{Exp}(i\alpha(t)I_y)T_{10}\text{Exp}(-i\alpha(t)I_y) = \sum_{q_1=-1}^{1} T_{1q_1} d_{0q_1}^{(1)}(\alpha(t)) \tag{26B}$$

$$\text{Exp}(i\varepsilon(t)I_x)T_{1q_1}\text{Exp}(-i\varepsilon(t)I_x) = \sum_{q_2=-1}^{1} T_{1q_2} d_{q_1 q_2}^{(1)}(\varepsilon(t))\text{Exp}(iq_2\pi/2) \tag{26C}$$

$$\text{Exp}(i\omega_E(t)I_z)T_{1q_2}\text{Exp}(i\omega_E(t)I_z) = T_{1q_2}\text{Exp}(iq_2\omega_E(t)) \tag{26D}$$

Here, the $T_{1q}$ are defined as first rank tensors of order q. Combining these relations yields the following expression for the Hamiltonian for exchange in the $\Omega_E$ frame (note, the angle $\epsilon$ is between Z″ and Z‴):

$$\delta(t)\tilde{\tilde{T}}_{10} = \sum_{q_2=-1}^{1}\sum_{q_1=-1}^{1} \mathrm{Exp}(iq_2\omega_E(t))\mathrm{Exp}(iq_2\pi/2)d^{(1)}_{q_1q_2}(\varepsilon(t))d^{(1)}_{0q_1}(\alpha(t))T_{1q_2} \quad (27)$$

With the following definitions:

$$\omega_{eff}(t) = \int_0^t \Omega_{eff}(t')dt' \quad (28A)$$

$$\omega_E(t) = \int_0^t \Omega_E(t')dt' \quad (28B)$$

Define $d^{(1)}_{qq_1}(\beta)$ as the rank 1 reduced Wigner matrix element with indices q and $q_1$ for an angular argument $\alpha$. Here, the nomenclature for the angular momentum of the spin ½ follows the convention:

$$T_{10} = I_z \quad (29A)$$

$$T_{11} = -\frac{1}{\sqrt{2}}I_+ \quad (29B)$$

$$T_{1-1} = \frac{1}{\sqrt{2}}I_- \quad (29C)$$

To address the relaxation driven time-evolution governed by exchange, use second order perturbation theory along with treatment of the interaction with the lattice and the RF field. The following Master Equation describes the rate of change of the density matrix in the TRF:

$$\frac{d\tilde{\tilde{\sigma}}(t)}{dt} = -\int_0^\infty \left\{ \left[\tilde{\tilde{H}}_{ex}(t), \left[\tilde{\tilde{H}}^{\pm}_{ex}(t-\tau), \tilde{\tilde{\sigma}}(t)\right]\right]\right\}d\tau \quad (30)$$

where the { } indicates the taking of an ensemble average. Note that the symbol ± indicates the taking of the Hermitian adjoint, and in particular, adopt the convention:

$$T_{1q}^{\pm} = (-1)^q T_{1-q} \quad (31)$$

Using Equations 25-29, and using secular approximation, find:

$$\frac{d\tilde{\tilde{\sigma}}(t)}{dt} = -\int_0^\infty \{\delta(t)\delta(t-\tau)\}\sum_{q_2=-1}^{1}\sum_{q_1=-1}^{1}\mathrm{Exp}(i\tau q_2\Omega_E(t))\left(d^{(1)}_{q_1q_2}(\varepsilon(t))\right)^2 \quad (32)$$

$$\left(d^{(1)}_{0q_1}(\alpha(t))\right)^2(-1)^{q_2}\left[T_{1q_2}, \left[T_{1-q_2}, \tilde{\tilde{\sigma}}(t)\right]\right]d\tau$$

Assume an exponential dependence for the correlation function by writing:

$$\{\delta(t)\delta(t-\tau)\} \propto \mathrm{Exp}(-\tau/\tau_{ex}) \quad (33)$$

where $\tau_{ex}$ is the lifetime of the spin in either of the two exchanging sites. Then carrying out the integration, the spectral density has the following relation:

$$J(q_2\Omega_E(t)) = K_{ex}\frac{\tau_{ex}}{(1+((q_2\Omega_E(t)\tau_{ex})^2)}, \quad (34)$$

where $K_{ex} = p_a p_b (\delta\omega)^2$.

Substituting Equations 34 into Equation 32, find:

$$\frac{d\tilde{\tilde{\sigma}}(t)}{dt} = -\sum_{q_2=-1}^{1}\sum_{q_1=-1}^{1}J(q_2\Omega_E(t))\left(d^{(1)}_{q_1q_2}(\varepsilon(t))\right)^2 \quad (35)$$

$$\left(d^{(1)}_{0q_1}(\alpha(t))\right)^2(-1)^{q_2}\left[T_{1q_2}, \left[T_{1-q_2}, \tilde{\tilde{\sigma}}(t)\right]\right]d\tau$$

Next, use Equation 35 to find the rate of change in time of an observable the TRF for the CE mechanism. Assume:

$$\frac{d\langle\tilde{\tilde{Q}}(t)\rangle}{dt} = Tr\left[\frac{d\tilde{\tilde{\sigma}}(t)}{dt}Q\right] \quad (36)$$

$$Tr\left[\left[T_{1q_2}, \left[T_{1-q_2}, \tilde{\tilde{\sigma}}(t)\right]\right]Q\right] = \quad (37)$$

$$Tr\left[[T_{1-q_2}, [T_{1q_2}, Q]]\tilde{\tilde{\sigma}}(t)\right] = \langle[T_{1-q_2}, [T_{1q_2}, Q]]\rangle(t)$$

Here Tr indicates the taking of the trace operation and < > means the expectation value for the TRF.

Next, evaluate the expectation value in Equation 37. This means obtain the value of the double commutator for typical values of Q such as $I_0$ and $I_{+1}$. Consider a general approach using the Clebsch Gordan coefficients:

$$\langle[T_{1-q_2}, [T_{1q_2}, T_{10}]]\rangle = \quad (38A)$$

$$2\sum_{M=-1}^{1}(111M | 1q_2 10)(1110 | 1-q_2 1M)\langle T_{10}\rangle(t)$$

$$\langle[T_{1-q_2}, [T_{1q_2}, T_{1\pm 1}]]\rangle = \quad (38B)$$

$$2\sum_{M=-1}^{1}(111M | 1q_2 1\pm 1)(111\pm 1 | 1-q_2 1M)\langle T_{1\pm 1}\rangle(t)$$

Using these relations in Equation 35, obtain:

$$\frac{d\langle\tilde{\tilde{T}}_{10}\rangle(t)}{dt} = \quad (39A)$$

$$-2\sum_{q_2=-1}^{1}\sum_{q_1=-1}^{1}\sum_{M=-1}^{1}\sum_{M_1=-1}^{1}J[q_2\Omega_E(t)](-1)^{q_2}\left(d^{(1)}_{q_1q_2}[\varepsilon(t)]\right)^2$$

$$\left(d^{(1)}_{0q_1}[\alpha(t)]\right)^2(111M | 1q_2 10)(111M_1 | 1(-q_2)1M)\langle\tilde{\tilde{T}}_{1o}\rangle(t)$$

$$\frac{d\langle\tilde{\tilde{T}}_{11}\rangle(t)}{dt} = \quad (39B)$$

$$-2\sum_{q_2=-1}^{1}\sum_{q_1=-1}^{1}\sum_{M=-1}^{1}\sum_{M_1=-1}^{1}J[q_2\Omega_E(t)](-1)^{q_2}\left(d^{(1)}_{q_1q_2}[\varepsilon(t)]\right)^2$$

$$\left(d^{(1)}_{0q_1}[\alpha(t)]\right)^2(111M | 1q_2 11)(111M_1 | 1(-q_2)1M)\langle\tilde{\tilde{T}}_{11}\rangle(t)$$

Equations 39A and 39B are the longitudinal and transverse rate equations for the magnetization in the TRF for the exchange mechanism. When $\epsilon(t)$ goes to zero upon transformation from the third to the second frame, the corresponding reduced Wigner matrix element goes to the Kronecker delta in $q_1 q_2$ and $q_1$ equals to $q_2$. Note that $\Omega_{eff} \approx \Omega_E$. If the tilt angle $\alpha(t)$ goes to zero upon transform from the second to the first frame, $q_1$ becomes zero by the properties of the reduced Wigner matrix element noted above and the rate constants become time independent. The following are the equations for the transverse and longitudinal relaxation rate constants in $\Omega_E$ frame:

$$R_{2\rho,E}(t) = -p_a p_b \delta \omega^2 \begin{pmatrix} \cos(\varepsilon(t))^2 \cos(\alpha(t))^2 \tau_{ex} + \\ \frac{1}{2}\sin(\varepsilon(t))^2 \sin(\alpha(t))^2 \tau_{ex} + \\ \frac{1}{2}\left(\cos(\alpha(t))^2 \sin(\varepsilon(t))^2 + \right. \\ \left. \sin(\alpha(t))^2 \sin\left(\frac{\varepsilon(t)}{2}\right)^4 + \right. \\ \left. \sin(\alpha(t))^2 \cos\left(\frac{\varepsilon(t)}{2}\right)^4 \right) \frac{\tau_{ex}}{1+(\Omega_E(t)\tau_{ex})^2} \end{pmatrix} \quad (40A)$$

$$R_{1\rho,E}(t) = -p_a p_b \delta \omega^2 \begin{pmatrix} \left(\cos(\alpha(t))^2 \sin(\varepsilon(t))^2 + \right. \\ \left. \sin(\alpha(t))^2 \sin\left(\frac{\varepsilon(t)}{2}\right)^4 + \right. \\ \left. \sin(\alpha(t))^2 \cos\left(\frac{\varepsilon(t)}{2}\right)^4 \right) \frac{\tau_{ex}}{1+(\Omega_E(t)\tau_{ex})^2} \end{pmatrix} \quad (40B)$$

The foregoing describes the exchange-induced relaxations for two site fast exchange in the third rotating frame. The method of derivations is based on the density matrix formalism, and is valid in the fast exchange regime. The derived equations are valid in the third rotating frame and the methods proposed can be used for the description of exchange-induced relaxations in the high rotating frames of rank n>2. Example calculations of the $R_{1\rho,E}(t)$ and $R_{2\rho,E}(t)$ for different angle $\epsilon$ are shown in FIG. 10, with FIGS. 10A, 10B, and 10C showing $R_{1\rho,E}(t)$ and FIGS. 10D, 10E, and 10F showing $R_{2\rho,E}(t)$. It can be seen that the relaxation rate constants resemble modulation functions of the pulses and are significantly $\epsilon$ dependent.

According to one example of the present subject matter, modulation functions corresponding to RAFF3 can be calculated using the foregoing equations. FIGS. 7A and 7B illustrate the modulation functions and FIG. 7C illustrates the bandwidth of the pulse for $\alpha(2)=45°$.

By way of further example, the series of illustrations in FIGS. 8A, 8B, and 8C illustrate effective fields for RAFF (in which the rank order n=2), denoted here as E. The figures illustrate tip angles of 8, 45, and 82 degrees and the corresponding frequency and phase in the time domain.

FIGS. 9A, 9B, and 9C illustrate time domain representations of amplitude modulated functions corresponding to RAFF3, RAFF4, and RAFF5 pulses. The pulse series are generated using Equations 11 and 12 set forth above.

Unlike a traditional rotary echo sequence in which pulses have a duration on the order of one millisecond and are separated by an interval of approximately one millisecond, the present subject matter can be configured for nearly instantaneous flipping of the fictitious fields and at a repetition rate that is measured in microseconds.

One method includes collecting magnetic resonance data by applying a modulated field having perturbations configured to excite a system. The method also includes generating data based on a magnetic resonance signal received from the system in which the data corresponds to relaxation of magnetization arising in a rotating frame of a particular rank and based on relaxation arising in a rotating frame of a different rank. An axis of the higher order rotating frames is established by holding as stationary a fictitious field defined in a lower order frame of reference.

When transitioning to a higher rotating frame, the contribution of exchange is strongly decreasing to the relaxation and could be significantly suppressed.

Figure 11:
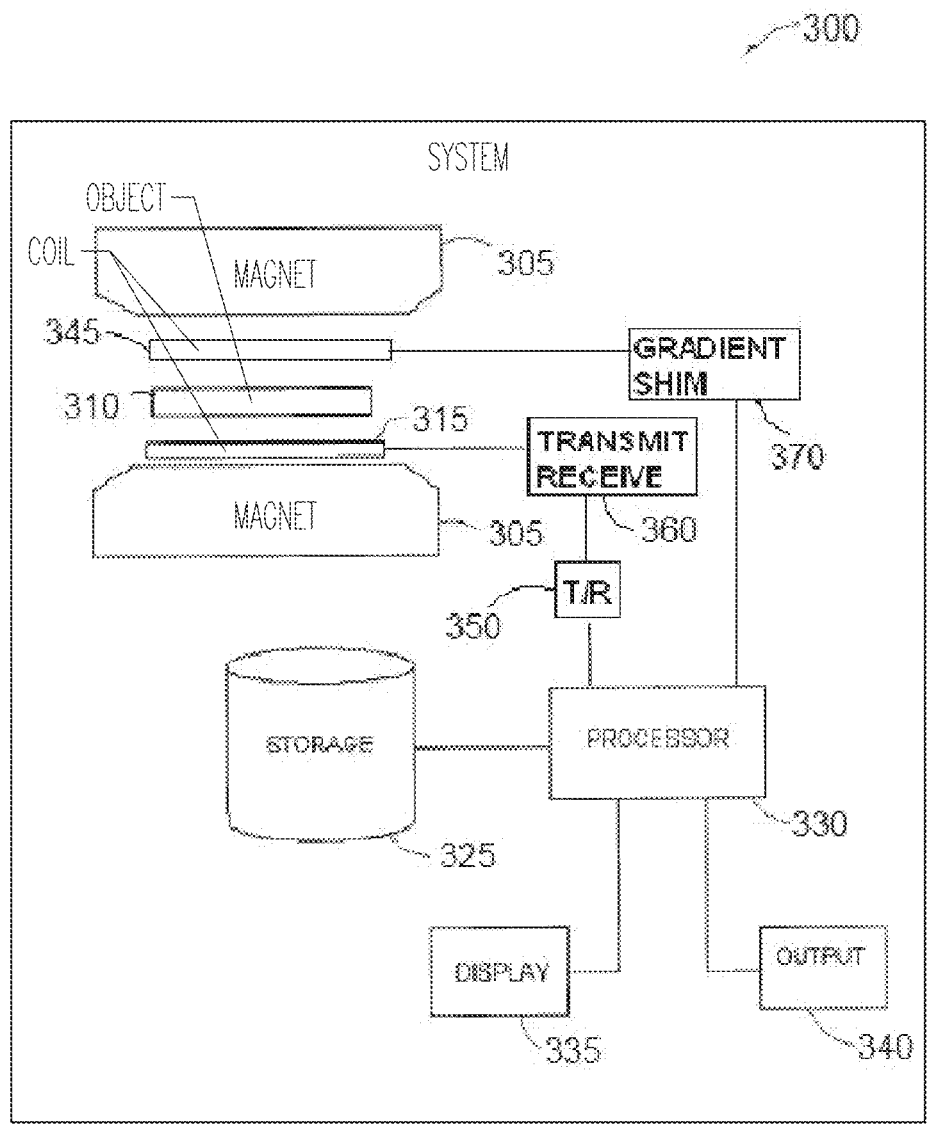
FIG. 11 illustrates a system according to one example.

FIG. 11 includes a block diagram of imaging system 300. Imaging system 300, in this example, depicts a magnetic resonance system and includes magnet 305. Coil 315 and object 310 are positioned within the field of magnet 305. Object 310 can include a human body, an animal, a phantom, or other specimen. Coil 315, sometimes referred to as an antenna, can include a transmit coil, a receive coil, or both a transmitter and receiver coil. In various examples, module 360 includes a front end coupled to a transmit coil and an amplifier coupled to a receiver coil. Module 360 is coupled to processor 330 by T/R switch 350.

Gradient/shim coil 345 is proximate object 310 and is coupled to module 370. Module 370 provides control and power signals to coil 345 to apply a gradient and to apply a shim field.

As a receive coil, coil 315 provides a signal to receiving unit 320. Receiving unit 320 can include an analog-to-digital converter (ADC), a pre-amplifier, a filter, or other module to prepare the received signal for processing. Receiving unit 320 is coupled to processor 330. In one example, system 300 includes a transmit unit and a transmit coil configured to provide excitation to object 310.

Processor 330 can include a digital signal processor, a microprocessor, a controller, or other module to perform an operation on the signal from the receiving unit. Processor 330 is also coupled to storage 325, display 335 and output unit 340.

Storage 325 can include a memory for storing data. The data can include image data as well as results of processing performed by processor 330. In one example, storage 325 provides storage for executable instructions for use by processor 330. The instructions can be configured to implement a particular algorithm.

Display 335 can include a screen, a monitor, or other device to render a visible image corresponding to object 310. For example, display 335 can be configured to display a radial projection, a Cartesian coordinate projection, or other view corresponding to object 310. Output unit 340 can include a printer, a storage device, a network interface or other device configured to receive processed data.

Processor 330 is configured to execute an algorithm to control T/R switch 350, module 360, coil 315, module 370, and coil 345 in order to implement a method as described herein. For example, processor 330 can be configured to generate a pulse sequence to generate a fictitious field and perform spin lock imaging according to RAFFn. In addition, processor 330 can be configured to generate contrast in the manner described herein.

Figure 12:
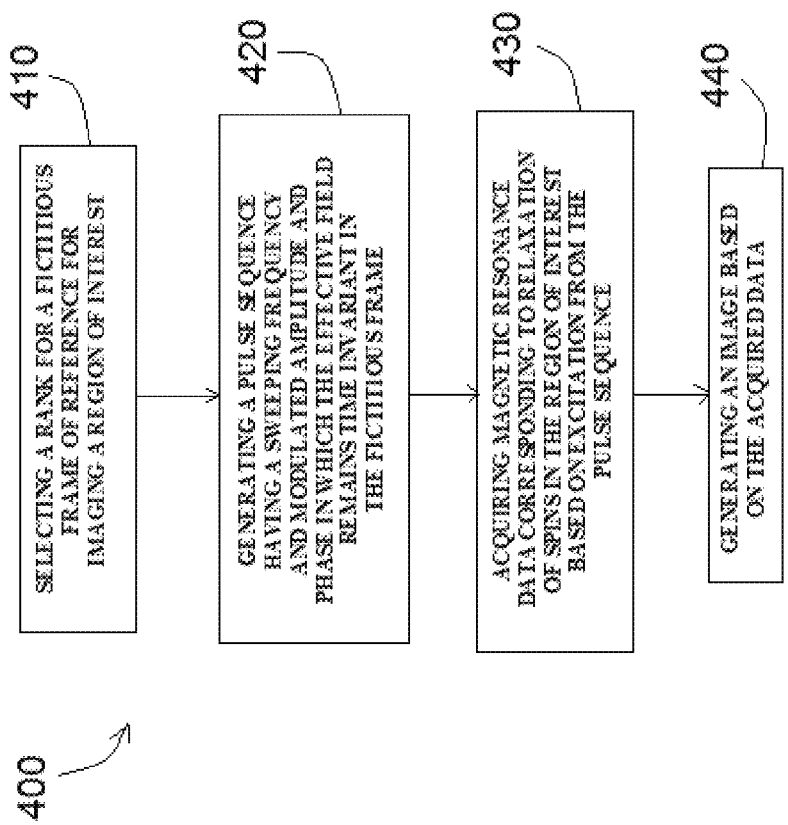
FIG. 12 illustrates a method according to one example.

FIG. 12 includes a block diagram of method 400 according to one example. Method 400 includes, at 410, selecting a rank for a fictitious frame of reference for imaging a region of interest. The rank can be greater than or equal to 2 in value. At 420, the method includes generating a pulse sequence having a sweeping frequency and modulated amplitude and phase in which the effective field remains time invariant in the fictitious frame. The pulse sequence, in one example is configured to violate the adiabatic condition. At 430, method 400 includes acquiring magnetic resonance data corresponding to relaxation of spins in the region of interest based on excitation from the pulse sequence. At 440, the method includes generating an image based on the acquired data.

VARIOUS NOTES & EXAMPLES

The present subject matter includes a class of RF pulses that are amplitude and frequency modulated based on recursive functions sine and cosine. The frequency-swept pulses are configured to generate relaxation-based MRI contrast exploiting rotating frames of rank 1≤n≤5. The method exploits relaxations along a fictitious field, in which the fictitious fields are generated during non-adiabatic rotation. The fictitious fields can be treated as locking magnetic fields. In rotating frame experiments, one example of the present subject matter provides reduced SAR as compared to conventional and adiabatic rotating frame methods and can generate effective locking magnetic fields with greater amplitude than the applied $B_1$ amplitude.

The present subject matter can be applied to various types of spectroscopy data. For example, the spectroscopy data can include optical data or magnetic resonance data. The examples presented herein are non-limiting and can be combined in any permutation or combination.

Example 1 can include a system. The system can include a driving module configured to apply a perturbation to a sample. The perturbation can include RF excitation. The system includes a processor configured to define a plurality of different rotating frames of reference relative to the perturbation. Each frame of reference has a corresponding fictitious field. The fictitious field can be produced by interaction of the plurality of different rotating frames of reference. The system can include a readout module coupled to the processor. The readout module is configured to generate an output based on relaxation of spins of the sample as a function of the perturbation.

Example 2 can include, or can optionally be combined with the subject matter of Example 1, to optionally include wherein the processor is configured to generate a frequency swept pulse.

Example 3 can include, or can optionally be combined with the subject matter of one or any combination of Examples 1 or 2 to optionally include wherein the driving module is configured to deliver a frequency swept pulse.

Example 4 can include, or can optionally be combined with the subject matter of one or any combination of Examples 1 through 3 to optionally include wherein the driving module is configured to apply a pulse train.

Example 5 can include, or can optionally be combined with the subject matter of one or any combination of Examples 1 through 4 to optionally include wherein the processor is configured to instantaneously flip the fictitious field.

Example 6 can include, or can optionally be combined with the subject matter of one or any combination of Examples 1 through 5 to optionally include at least one of a display or printer coupled to the readout module.

Example 7 can include a method. The method can include applying a perturbation to a system. The method includes defining a plurality of different rotating frames relative to the perturbation, wherein each frame has a corresponding fictitious field and wherein the plurality includes at least three. The method includes applying a readout module to the system after applying the perturbation.

Example 8 can include, or can optionally be combined with the subject matter of Example 7, to optionally include wherein applying the perturbation to the system includes applying magnetic perturbation to a spin system.

Example 9 can include, or can optionally be combined with the subject matter of one or any combination of Examples 7 or 8 to optionally include wherein at least one fictitious field remains constant in at least one rotating frame.

Example 10 can include, or can optionally be combined with the subject matter of one or any combination of Examples 7 through 9 to optionally include wherein at least one fictitious field is time dependent.

Example 11 can include, or can optionally be combined with the subject matter of one or any combination of Examples 7 through 10 to optionally include decreasing relaxation of the spin system in a selected rotating frame of the plurality of different rotating frames.

Example 12 can include, or can optionally be combined with the subject matter of one or any combination of Examples 7 through 11 to optionally include generating a rotating frame rotary echo in the spin system.

Example 13 can include, or can optionally be combined with the subject matter of one or any combination of Examples 7 through 12 to optionally include locking magnetization of the system to a fictitious field of a selected rotating frame.

Example 14 can include, or can optionally be combined with the subject matter of one or any combination of Examples 7 through 13 to optionally include wherein the fictitious field is non-stationary.

Example 15 can include, or can optionally be combined with the subject matter of one or any combination of Examples 7 through 14 to optionally include wherein applying the perturbation includes applying a frequency swept pulse.

Example 16 can include, or can optionally be combined with the subject matter of one or any combination of Examples 7 through 15 to optionally include wherein at least one fictitious field remains constant in amplitude.

Example 17 can include, or can optionally be combined with the subject matter of one or any combination of Examples 7 through 16 to optionally include wherein at least one fictitious field is time dependent.

Example 18 can include, or can optionally be combined with the subject matter of one or any combination of Examples 7 through 17 to optionally include wherein at least one fictitious field remains constant in direction.

Example 19 can include a processor-implemented method for generating a magnetic resonance image. The method can include selecting a rank for a fictitious frame of reference for imaging a region of interest. The method can include generating a pulse sequence having a sweeping frequency and modulated amplitude and phase in which the effective field remains time invariant in the fictitious frame. The method can include acquiring magnetic resonance data corresponding to relaxation of spins in the region of interest based on excitation from the pulse sequence. The method can include generating an image based on the acquired data.

Example 20 can include, or can optionally be combined with the subject matter of Example 19, to optionally include wherein the pulse sequence is sub-adiabatic.

Example 21 can include, or can optionally be combined with the subject matter of one or any combination of Examples 19 or 20 to optionally include wherein the rank is greater than 2.

Each of the forgoing non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A magnetic resonance (MR) system comprising:
a driving module configured to apply a perturbation to a sample;
a processor configured to generate RF modulated pulses, the RF modulated pulses configured to define a plurality of at least three different rotating frames of reference relative to the perturbation, the plurality of at least three different rotating frames of reference including at least two frames in which each frame of the at least two frames includes a fictitious field and wherein at least one fictitious field is time variant, the fictitious fields are produced by an interaction of the plurality of the at least three different rotating frames of reference, and each different rotating frame is associated with an effective field, wherein the fictitious fields and the effective fields are associated with the generated modulated pulses and the modulated pulses are produced by a recursive expansion; and
a readout module coupled to the processor and configured to generate an output based on a relaxation of spins of the sample as a function of the perturbation in order to display or store a magnetic resonance output with the readout module.

2. The system of claim 1 wherein the processor is configured to generate a frequency swept pulse, wherein the frequency swept pulse corresponds to a modulated pulse of the generated modulated pulses.

3. The system of claim 1 wherein the driving module is configured to deliver a frequency swept pulse, wherein the frequency swept pulse corresponds to a modulated pulse of the generated modulated pulses.

4. The system of claim 1 wherein the driving module is configured to apply a pulse train, wherein the pulse train corresponds to the generated modulated pulses.

5. The system of claim 1 wherein the processor is configured to instantaneously flip a magnetization of the fictitious field.

6. The system of claim 1 further including at least one of a display or a printer that is coupled to the readout module, wherein the display or the printer is configured to render a visible image corresponding to the output from the readout module.

7. The system of claim 1 wherein at least one rotating frame of reference of the spin system includes modulation of amplitude or frequency based on a tangent function.

8. A magnetic resonance method comprising:
applying a perturbation to a system;
generating RF modulated pulses, the RF modulated pulses configured to define a plurality of at least three different rotating frames relative to the perturbation, the plurality of at least three different rotating frames including at least two frames in which each frame of the at least two frames includes fictitious field and wherein at least one fictitious field is time dependent, the fictitious fields produced by interaction of the plurality of at least three different rotating frames, and wherein each different rotating frame is associated with an effective field and wherein the fictitious fields and the effective fields are associated with the modulated pulses and the modulated pulses are produced by a recursive expansion; and applying a readout module to the system after applying the perturbation in order to display or store a magnetic resonance output with the readout module.

9. The method of claim 8 wherein applying the perturbation to the system includes applying a magnetic perturbation to a spin system using a magnetic resonance system.

10. The method of claim 8 wherein at least one fictitious field remains constant in the at least one rotating frame of the at least three different rotating frames.

11. The method of claim 8 further including decreasing a relaxation of the spin system in a selected rotating frame of the plurality of at least three different rotating frames.

12. The method of claim 8 further including generating a rotating frame rotary echo in the spin system using a magnetic resonance system.

13. The method of claim 8 further including locking a magnetization of the system to a fictitious field of a selected rotating frame of the at least three different rotating frames.

14. The method of claim 8 further wherein at least one fictitious field is non-stationary.

15. The method of claim 8 wherein applying the perturbation to the system includes applying a frequency swept pulse.

16. The method of claim 8 wherein at least one fictitious field of the system remains constant in amplitude.

17. The method of claim 8 wherein at least two of the fictitious fields of the system are time dependent.

18. The method of claim 8 wherein at least one fictitious field of the system remains constant in a direction.

19. A non-transitory processor-implemented method which, when executed, causes a magnetic resonance system to generate a magnetic resonance image, the method comprising:

selecting a rank for a fictitious frame of reference that images a region of interest in a spin system, wherein the selected rank corresponds to at least three different fictitious frames of reference;

generating a sequence of modulated pulses that excites the spin system with the sequence of modulated pulses having a sweeping frequency and both a modulated amplitude and phase in which the effective field varies with time in the fictitious frame, wherein the effective field is associated with the sequence of modulated pulses and wherein the sequence of modulated pulses are produced by a recursive expansion;

acquiring magnetic resonance data corresponding to the spin system, the data corresponding to relaxation of spins in the region of interest based on excitation from the sequence of modulated pulses; and generating an MR image with a processor based on the acquired data.

20. The method of claim 19 wherein the sequence of modulated pulses includes at least one pulse that is sub-adiabatic.

21. The method of claim 19 wherein the rank is greater than 2.

22. A magnetic resonance (MR) system comprising:

a driving module configured to apply a perturbation to a sample;

a processor configured to generate modulated pulses to define at least n different rotating frames of reference where n is an integer of at least three, the rotating frames of reference including at least n−1 frames in which each of the n−1 frames includes a fictitious field and wherein at least one fictitious field is time variant, the fictitious fields produced by interaction of the plurality of at least n different rotating frames of reference, and wherein each different rotating frame of reference is associated with an effective field and wherein the fictitious fields and the effective fields are associated with the modulated pulses and the modulated pulses are produced by a recursive expansion; and a readout module coupled to the processor and configured to generate an output based on relaxation of spins of the sample as a function of the perturbation that is displayed or stored by the MR system.

\* \* \* \* \*